United States Patent [19]

Chen et al.

[11] Patent Number: 4,994,763
[45] Date of Patent: Feb. 19, 1991

[54] UNIVERSAL VOLTAGE-CONTROLLED MULTIVIBRATOR

[76] Inventors: Haw-Renn Chen; Feichu H. Chen, both of 4057 Little Hollow Pl., Moorpark, Calif. 93021

[21] Appl. No.: 435,672

[22] Filed: Nov. 13, 1989

[51] Int. Cl.$^5$ .............................................. H03B 5/20
[52] U.S. Cl. ...................... 331/57; 331/135; 331/143; 331/177 R
[58] Field of Search ............... 331/57, 111, 135, 137, 331/143, 177 R, DIG. 3

[56] References Cited

U.S. PATENT DOCUMENTS 3,914,712  10/1975  Currie .......................... 331/143 X
4,145,670   3/1979  Bode ............................ 331/137 X

FOREIGN PATENT DOCUMENTS 0171022  2/1986  European Pat. Off. ............ 307/605

Primary Examiner—Siegfried H. Grimm

[57] ABSTRACT

A universal voltage-controlled multivibrator comprises a signal state conversion circuit and a feedback circuit. The signal state conversion circuit has the output states as a function of the input states. The feedback circuit, containing multiple controlling input terminals, has a propagation delay time as a function of the electrical signal applied to the controlling input terminals. One output of the signal state conversion circuit is connected to one input of the feedback circuit and the output of the feedback circuit is connected to one input of the signal state conversion circuit such that the output of the signal state conversion circuit is fed back to its input to have the period of its output signal be controllable by the signals applied to the controlling input terminals of the feedback circuit.

7 Claims, 1 Drawing Sheet

UNIVERSAL VOLTAGE-CONTROLLED MULTIVIBRATOR

BACKGROUND OF THE INVENTION

A voltage-controlled multivibrator (VCM) can be utilized in various applications which include the use of the VCM in phaselocked loops for digital frequency control, such as the phaselocked loop used in the magnetic storage devices. Currently, there are several commercial vendors providing the VCM devices. However, to utilize these commercially-available VCM devices requires a thorough knowledge of the operation of the resonator, in addition to all the basic electrical circuit theories, and thorough understanding of the functions, utilities, and application configurations of the VCM devices provided by the commercial vendors. These vastly limit the utilizations of the VCM devices to only a small group of professional users and, as a result, confine the VCM devices to be used for a very limited application fields, although the VCM devices have very high potential to be used much more popularly than they do nowadays.

OBJECTS AND ADVANTAGES OF THE INVENTION

Accordingly, it is the concern of the present invention to eliminate the limitations of utilizing the existing commercially-available VCM devices. Also, the present invention is to provide several advantages as follows:

(1) Due to the specific feedback configuration of the present invention, plural controlling inputs can be assigned or made into the present invention such that, with plural controlling inputs, the present invention can easily perform tasks that are difficult or even impossible to be achievable by the conventional VCM or voltage-controlled oscilltor (VCO) devices.

(2) The configuration and structure of the present invention are simpler and easier to understand than the conventional VCM or VCO devices.

(3) The operations and functions of the present invention are more predictable and controllable than those of the conventional VCM or VCO devices for its simple and straightforward circuit structure.

(4) The present invention doesn't use any external oscillator or resonator, which are used by the conventional VCM or VCO devices. The omission of the external oscillator or resonator makes the cost and development time lower by using the present invention than using the conventional VCM or VCO devices.

(5) The present invention provides a wide electronic-tuning-range in terms of percentage of center frequency.

DESCRIPTION OF THE EMBODIMENT

Figure 1:
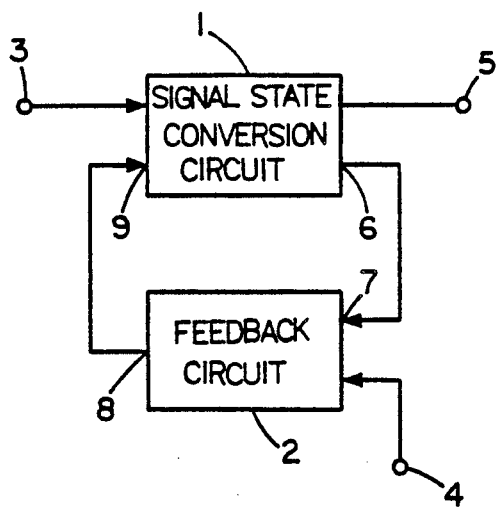
FIG. 1 illustrates a basic configuration of the universal voltage-controlled multivibrator.

A Universal Voltage-Controlled Multivibrator (UVCM) comprises a signal state conversion circuit means 1 and a feedback circuit means 2, as shown in FIG. 1. Both of the signal state conversion circuit means 1 and the feedback circuit means 2 have preferably plural inputs and/or outputs as illustrated in FIG. 1 for a double-input-double-output signal state conversion circuit means and a double-input-single-output feedback circuit means.

The output states of the signal state conversion circuit means 1 are a function of the input states. The feedback circuit means can provide an adjustable propagation delay time of a signal from a selected input to the output as a function of the states of the inputs. Generally, at least one of the outputs of the signal state conversion circuit means is connected to the appropriate inputs of the feedback circuit means while the output of the feedback circuit means is connected to the appropriate inputs of the signal state conversion circuit means. As a result of the above setup, the outputs of the signal state conversion circuit means will vary states in the way, either periodically or non-periodically, depending upon the functions of the feedback circuit means as well as the functions of the signal state conversion circuit means itself.

FIG. 1 illustrates that the output 6 of the signal state conversion circuit means 1 is connected to the input 7 of the feedback circuit means 2 and the output 8 of the feedback circuit means 2 is connected to the input 9 of the signal state conversion circuit means 1. The input 4 of the feedback circuit means 2 is used as the controlling input to the feedback circuit means. The input 3 of the signal state conversion circuit means 1 is used as the controlling input to the signal state conversion circuit means 1.

Figure 2:
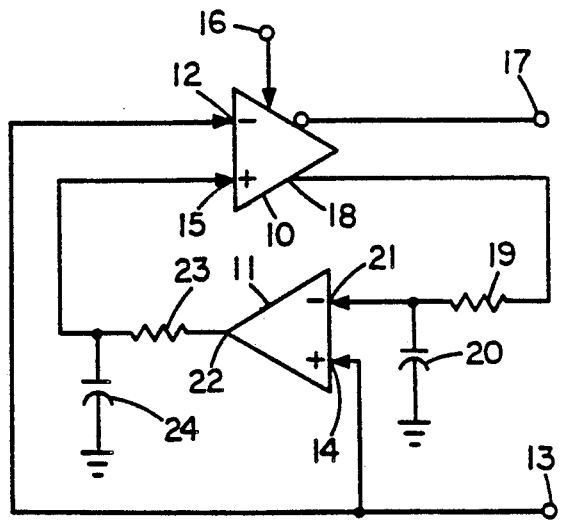
FIG. 2 illustrates the circuitries of a universal voltage-controlled multivibrator with single voltage controlling input.
Figure 3:
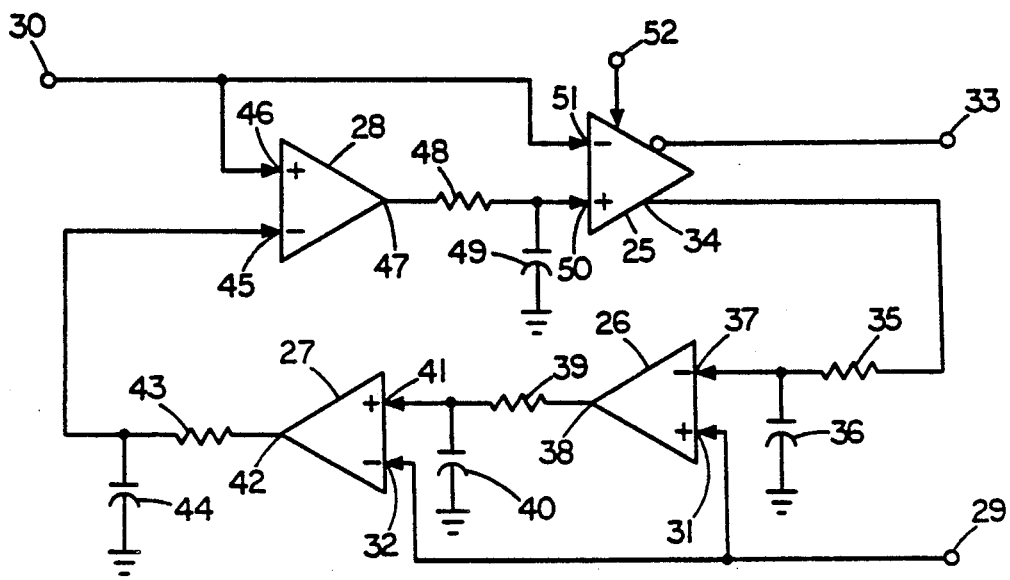
FIG. 3 illustrates the circuitries of a universal voltage-controlled multivibrator with dual voltage controlling inputs.
Figure 4:
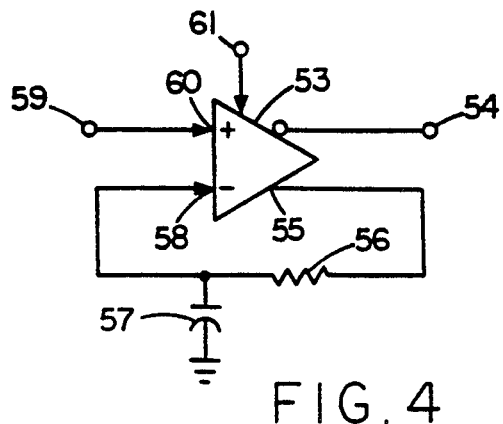
FIG. 4 illustrates the circuitries of the universal voltage-controlled multivibrator used as a signal duty-cycle controlling means.

Various circuitries can be utilized as the signal state conversion circuit means or the feedback circuit means depending upon what types of the output signals are desired. FIG. 2 illustrates the circuitries utilized as the signal state conversion circuit means and the feedback circuit means for a UVCM which requires only a single voltage controlling input. FIG. 3 illustrates the circuitries utilized as the signal state conversion circuit means and the feedback circuit means for a UVCM which requires multiple voltage-controlling inputs. FIG. 4 illustrates the circuitries utilized as the signal state conversion circuit means and the feedback circuit means for a UVCM used as a signal duty-cycle controlling means.

As can be seen in FIG. 2, a complementary-output comparator lo is used as the signal state conversion circuit means while the passive components, 19, 20, 23, and 24, and a comparator 11 are used as the feedback circuit means. The complementary output 17 of 10 serves as the output of the UVCM and the output 18 of 10 is connected to the input 21 of 11 through the RC circuit of 19 and 20. The output 22 of 11 is connected to the input 15 of 10 through the RC circuit of 23 and 24. The input terminal 13, which is connected to the input 14 of 11 and the input 12 of 10, serves the UVCM as a primary voltage-controlling input. The input terminal 16 is used as a reset input to reset the initial states of the UVCM.

FIG. 3 illustrates a UVCM with multiple voltage-controlling input terminals. As can be seen in FIG. 3, a complementary-output comparator 25 is used as the signal state conversion circuit means while the passive components, 35, 36, 39, 40, 43, 44, 48, and 49, and the comparators, 26, 27, and 28, are used as the feedback circuit means. The complementary output 33 of 25 serves as the output of the UVCM and the output 34 of 25 is connected to the input 37 of 26 through the RC circuit of 35 and 36. The output 38 of 26 is connected to the input 41 of 27 through the RC circuit of 39 and 40. The output 42 of 27 is connected to the input 45 of 28 through the RC circuit of 43 and 44. The output 47 of 28 is connected to the input 50 of 25 through the RC circuit of 48 and 49. The input terminal 29, which is connected to the input 31 of 26 and the input 32 of 27, serves the UVCM as a primary voltage-controlling input while the input terminal 30, which is connected to the input 46 of 28 and the input 51 of 25, serves as the secondary voltage-controlling input. The input terminal 52 is used as a reset input to reset the initial states of the UVCM.

FIG. 4 illustrates the application of a UVCM as a signal duty-cycle controlling means. As can be seen in FIG. 4, a complementary-output comparator 53 is used as the signal state conversion circuit means while the passive components 56 and 57 are used as the feedback circuit means. The complementary output 54 of 53 serves as the output terminal of the signal duty-cycle controlling means. The output 55 of 53 is connected to the input end of the RC circuit, 56 and 57, and the output end of the RC circuit is connected to the minus-input 58 of 53. The input terminal 59, which is connected to the input 60 of 53, serves as the signal duty-cycle controlling input. The input terminal 61 is used as a reset input to reset the initial states of the signal duty-cycle controlling means.

OPERATION OF THE INVENTION

FIGS. 2 and 3 are used as the examples to illustrate the logic operation of the UVCM while FIG. 4 is used to illustrate the operation of the UVCM as a signal duty-cycle controlling means. In FIG. 2, the resistors 19 and 23, with the resistance values of R19 and R23 respectively, and the capacitors 20 and 24, with the capacitance values of C20 and C24 respectively, are installed to have the slew rate of the feedback signals be longer such that the signal propagation delays through the overall feedback circuit means be adjustable by varying the voltage levels at the input terminal 13. However, it needs to be mentioned that, if linear signal edges or other signal edges different from the RC rising format are needed, a more sophisticated circuit than a RC-circuit may be used.

Let the maximum voltage level of the logic state '0' be V0, the minimum voltage level of the logic state '1' be V1, and the voltage level at the input terminal 13 be V2, which falls in between V0 and V1, then the output 22 of 11 will switch states when the voltage level at the input 21 reaches and passes the voltage level of V2, either from low to high or from high to low. Likewise, the outputs 17 and 18 of 10 will switch states when the voltage level at the input 15 reaches and passes V2, either from low to high or from high to low. Since the RC-constants of R19C20 and R23C24 make the slew rate of the signal to the inputs 21 and 15 slower by charging or discharging the capacitors through the resistors, the time needed for the inputs 15 and 21 to reach the voltage levels of the inputs 12 and 14 of 10 and 11 respectively is elongated by the RC-constants of R23C24 as well as R19C20. As the voltage levels at the input 12 and input 14 vary, the time needed for the input 15 or input 21 to reach the voltage levels of the inputs 12 and 14 of 10 and 11 respectively is varied such that the overall signal propagation delay through the feedback circuit means and signal state conversion circuit means will vary in the same manner as well. Consequently, the output signal at the outputs 17 and 18 of the signal state conversion circuit means will have a period that is a function of the voltage level at the input terminal 13.

As can be seen in FIG. 2, if the reset input terminal 16 of the comparator 10 is tied to a logic high, the output 18 of the comparator 10 will be low such that, through 19, 20, 11, 23, and 24, the input 15 of the comparator 10 is at logic high provided that the voltage level V2 at the input terminal 13 is in between V0 and V1. If the logic state of the reset input 16 is switched from '1' to '0' after the input 15 of the comparator 10 has settled at logic '1' level, the complementary output 17 will change state from logic high to logic low while the output 18 will change state from logic low to logic high. The logic high signal at the output 18 can propagate through the resistor 19 to charge up the capacitor 20. Hence, the voltage at the input 21 of 11 is switching from logic low to logic high at the slew rate determined by the rising time constant R19C20. Once the voltage level at the input 21 of 11 is higher than the voltage V2 at the input terminal 13, the output 22 of 11 turns low. The output low from 22 then goes through the resistor 23 to discharge the capacitor 24 such that the input 15 of the comparator 10 is switching from logic high to logic low at the slew rate determined by the time constant R23C24. As the voltage level at the input 15 of the comparator 10 goes below V2, the output state of 17 switches from logic low to logic high and the output state of 18 switches from logic high to logic low. The logic low voltage at the output 18 of the comparator 10 then propagates through 19 to discharge the capacitor 20 such that the voltage level at the input 21 is switching from high to low at the slew rate determined by the time constant R19C20. Once the voltage at the input 21 is lower than V2, the output 22 of 11 turns high. The output high from 22 then goes through 23 to charge up the capacitor 24 at the slew rate determined by the time constant R23C24. As the voltage level at the input 15 of 10 is higher than V2, the output 17 switches state from high to low and the output 18 changes state from low to high. As a result, the outputs 17 and 18 toggle between the logic high and logic low complementarily with a period that is a function of the propagation time of the feedback circuit means, which includes 19, 20, 11, 23, and 24 as illustrated in FIG. 2, and the signal state conversion circuit means, which includes 10 as illustrated in FIG. 2.

In addition, due to the fact that the signal at the input 21 has nonlinear edges, the time for the signal at the input 21 to go from logic low level to the reference voltage level which is the voltage level at the input 14, is different from the time for the signal at the input 21 to go from logic high level to the reference voltage level. The phase shifts of the rising edge and the falling edge of the inverted output signal at 22 will be different. If a signal with 50% duty cycle is going to the input 21, the inverted output signal at the output 22 will have a duty cycle different from 50%. Since the output 22 has a signal inverted from the input signal at the input 21, a second comparator 10 is installed in a non-inverting configuration such that, after traversing the overall loop, any phase transition edge will go through a rising edge and a compensating falling edge or go through a falling edge and a compensating rising edge to have the phase shifts of the rising edge and the falling edge of the final signal output be equal to each other, and hence achieve the 50% duty cycle of a signal.

The circuit as shown in FIG. 3 basically has the same voltage-controlled multivibration function as the circuit shown in FIG. 2 except that the former has a wider range of controlling capability on the signal period and has more controlling inputs, as indicated by the input terminals 29 and 30. As can be seen in FIG. 3, the resistors 35, 39, 43, and 48 and the capacitors 36, 40, 44, and 49 are used to have the signal propagation delay through the overall feedback circuit means be adjustable by varying the voltage levels at the input terminals 29 and/or 30. Let the voltage at the input terminal 29 be V3 and the voltage at the input terminal 30 be V4 where both V3 and V4 fall in between V0 and V1, then the output 38 of 26 and the output 42 of 27 switch states as the voltage level at the inputs 37 and 41 reach and pass the voltage level of V3, either from low to high or from high to low. Likewise, the output 47 of 28 and the outputs 33 and 34 of 25 will switch states as the voltage level at the inputs 45 and 50 reach and pass V4, either from low to high or from high to low. As mentioned previously, the slew rates at the inputs 37, 41, 45, and 50 are increased by the RC constants of R35C36, R39C40, R43C44, and R48C49 respectively such that the overall signal propagation delay from the output 34 of 25 to the input 50 of 25 varies as a function of the voltage level at the input terminals 29 and/or 30. As a result, the signal period at the outputs 33 and 34 can vary as a function of the voltage levels at 29 and 30.

As illustrated in FIG. 4, if the reset input terminal 61 of the comparator 53 is tied to a logic high, the output 55 of the comparator 53 will be at logic low such that, through the resistor 56 and the capacitor 57, the input 58 of the comparator 53 is at logic low. If the logic state of the reset input 61 is switched from '1' to '0' after the input 58 has settled at logic low level, the output 55 will change state from logic low to logic high provided that the voltage level at the input terminal 59 is in between V0 and V1. The logic high signal at the output 55 propagates through the resistor 56 to charge up the capacitor 57. Hence, the voltage at the input 58 of 53 switches from logic low to logic high at the slew rate determined by the rising time constant R56C57. The output state 55, then, switches from logic high to logic low and the logic low signal from 55 will transmit through 56 and 57 to reach 58 with a slew rate determined by the falling time constant depending on R56C57. The output 55, then, switches from logic low to logic high again. The above process will repeat as long as the reset input 61 stays at logic low. Since the rising edge and the falling edge of a logic signal after a RC circuit are nonlinear, the outputs 54 and 55 will have an unbalanced duty cycle depending upon the values of R56C57 as well as the voltage level at 59.

SUMMARY, RAMIFICATION, AND SCOPE

Consequently, it can be seen that the universal voltage-controlled multivibrator of the present invention can perform tasks that are difficult or impossible to be achieved by using the conventional VCM or VCO devices, has a simple and easy-to-understand configuration, and has operations and functions more predictable and controllable than those of the conventional VCM or VCO devices. Also, the present invention doesn't contain any external oscillator or resonator such that the cost and development time of using the present invention are lower than using the conventional VCM or VCO devices. Furthermore, the universal VCM has the additional advantages as follows:

(a) it makes the applications of a VCM more accessable to a wide population;
(b) it makes the component assembly straight forward and easy for various designs due to the nature of its stable operation;
(c) it can have wider frequency control capability than the conventional VCM or VCO devices;
(d) it can be used as a signal duty-cycle controlling means.

Although the above descriptions of embodiment and operation contain many specifications, these should not be construed as limiting the scope of the invention but as merely providing illustrations of some of the presently preferred embodiments of this invention. For example, the state transfer means can use other circuits or components instead of a comparator; the feedback circuit means can contain various types of circuits and components instead of the mentioned comparators and the resistor-capacitors pairs; and a sine wave output can be achieved by adding an attenuator or by limiting output gain and so forth.

Thus the scope of the invention should be determined by the appended claims and their legal equivalents, rather than by the examples given.

We claim:

1. An electrical means for controlling the period of an electrical signal by varying controlling electrical signals comprising a signal state conversion circuit means and a feedback circuit means wherein said signal state conversion circuit means, having more than one input port with one of said input ports connected to one output of said feedback circuit means and more than one input port to be utilized as controlling input terminals, comprises an electrical circuit with the property of having output states, with propagation delay time to be controlled by said controlling input terminals, varying as a function of input states while said feedback circuit means, comprising one or more electrical comparing means and having more than one input port with one of said input ports connected to one output of said signal state conversion circuit means and more than one input port to be utilized as controlling input terminals, has a propagation delay time as a function of controlling electrical signals applied to said controlling input terminals and transmits the output signal of said signal state conversion circuit means back to said input port of said signal state conversion circuit means.

2. An electrical means for controlling the period of an electrical signal by varying the controlling electrical signals as set forth in claim 1 wherein said signal state conversion circuit means has at least two of its inputs used as a controlling input terminals.

3. An electrical means for controlling the period of an electrical signal by varying the controlling electrical signals as set forth in claim 1 wherein voltage levels are used as the controlling electrical signals.

4. An electrical means for controlling the period of an electrical signal by varying the controlling electrical signals as set forth in claim 1 wherein said signal state conversion circuit means comprises a multiple-input electrical-signal comparing means.

5. An electrical means for controlling the period of an electrical signal by varying the controlling electrical signals as set forth in claim 1 wherein said feedback circuit means comprises an electrical signal comparing means and two resistor-capacitor pairs.

6. An electrical means for controlling the period of an electrical signal by varying the controlling electrical signals as set forth in claim 1 wherein said feedback circuit means comprises multiple electrical signal comparing means and multiple resistor-capacitor pairs.

7. An electrical means for controlling the period of an electrical signal by varying the controlling electrical signals as set forth in claim 1 wherein said electrical means is used as an electrical-signal phase controlling means.

* * * * *